(12) United States Patent
Saito

(10) Patent No.: US 10,157,558 B2
(45) Date of Patent: Dec. 18, 2018

(54) DISPLAY DEVICE MANUFACTURING METHOD

(71) Applicant: JOLED INC., Tokyo (JP)

(72) Inventor: Nobuo Saito, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/314,291

(22) PCT Filed: May 22, 2015

(86) PCT No.: PCT/JP2015/002585
§ 371 (c)(1),
(2) Date: Nov. 28, 2016

(87) PCT Pub. No.: WO2015/186306
PCT Pub. Date: Dec. 10, 2015

(65) Prior Publication Data
US 2017/0193871 A1    Jul. 6, 2017

(30) Foreign Application Priority Data

Jun. 5, 2014 (JP) ................................ 2014-117116

(51) Int. Cl.
*G09G 3/36* (2006.01)
*G09G 5/10* (2006.01)
(Continued)

(52) U.S. Cl.
CPC ............... *G09G 3/006* (2013.01); *G09F 9/00* (2013.01); *G09G 3/3406* (2013.01);
(Continued)

(58) Field of Classification Search
CPC ............. G01N 21/95; G01N 2201/105; G01N 21/9501
See application file for complete search history.

(56) References Cited

U.S. PATENT DOCUMENTS

2004/0121183 A1 *  6/2004  Tanaka .................... H01J 29/28
                                                   428/690
2004/0218759 A1 * 11/2004  Yacobi ................. H04N 7/1696
                                                   380/210
(Continued)

FOREIGN PATENT DOCUMENTS

JP    2007-012581    1/2007
JP    2007-121990    5/2007
(Continued)

OTHER PUBLICATIONS

International Search Report (ISR) in International Pat. Appl. No. PCT/JP2015/002585, dated Aug. 4, 2015.

*Primary Examiner* — Nan-Ying Yang
(74) *Attorney, Agent, or Firm* — Greenblum & Bernstein, P.L.C.

(57) ABSTRACT

A display device manufacturing method includes: lighting up a display device for a predetermined period; measuring, as first brightness, brightness of the display device at a start of lighting; measuring, as second brightness, brightness of the display device when the predetermined period has elapsed; calculating a deterioration rate of the second brightness with respect to the first brightness; and discriminating the display device as a defective item if the deterioration rate is greater than a threshold value.

16 Claims, 9 Drawing Sheets

(51) Int. Cl.
  *G09G 3/00* (2006.01)
  *G09F 9/00* (2006.01)
  *H01L 51/50* (2006.01)
  *H05B 33/10* (2006.01)
  *H05B 33/12* (2006.01)
  *G09G 3/34* (2006.01)
  *H01L 51/00* (2006.01)

(52) U.S. Cl.
  CPC .......... *H01L 51/0031* (2013.01); *H01L 51/50* (2013.01); *H05B 33/10* (2013.01); *H05B 33/12* (2013.01); *G09G 2320/0233* (2013.01); *G09G 2320/043* (2013.01); *G09G 2320/045* (2013.01); *G09G 2320/048* (2013.01); *G09G 2320/0693* (2013.01); *G09G 2330/12* (2013.01); *G09G 2360/145* (2013.01); *G09G 2360/16* (2013.01); *H01L 2251/562* (2013.01)

(56) References Cited

U.S. PATENT DOCUMENTS

| | | |
|---|---|---|
| 2009/0109142 A1 | 4/2009 | Takahara |
| 2010/0225770 A1 | 9/2010 | Morimoto et al. |
| 2013/0078883 A1* | 3/2013 | Hiraoka .............. H01L 27/3244 445/2 |
| 2015/0103107 A1* | 4/2015 | Kobayashi ........... G09G 3/3413 345/691 |

FOREIGN PATENT DOCUMENTS

| | | | |
|---|---|---|---|
| JP | 2007121990 A | * | 5/2007 |
| JP | 2009-193037 | | 8/2009 |
| JP | 2010-204617 | | 9/2010 |
| JP | 2013-109868 | | 6/2013 |
| JP | 2013109868 A | * | 6/2013 |
| WO | 2011/155159 | | 12/2011 |

* cited by examiner

DISPLAY DEVICE MANUFACTURING METHOD

TECHNICAL FIELD

The present disclosure relates to a display device manufacturing method.

BACKGROUND ART

Patent Literature (PTL) 1 discloses an organic light-emitting element manufacturing method including predicting changes in brightness of an organic light-emitting device over time in a simplified manner so as to perform aging.

This method for manufacturing an organic light-emitting device includes first pre-measuring changes in brightness of an organic light-emitting element over time, performing fitting on these measured changes in brightness over time using a brightness reduction expression that is derived from a chemical reaction expression and a diffusion equation, and determining a fitting parameter of the brightness reduction expression. Next, the fitting parameter is used to determine a brightness temporal deterioration curve indicating temporal deterioration in brightness after the measurement time, thus calculating aging time based on the brightness temporal deterioration curve. Furthermore, based on the calculated aging time, the organic light-emitting element subjected to aging.

In the organic light-emitting device manufacturing method, this makes it possible to perform aging with high accuracy of predicting the changes in brightness over time.

CITATION LIST

Patent Literature

[PTL 1] Japanese Unexamined Patent Application Publication No. 2007-12581

SUMMARY OF INVENTION

Technical Problem

However, the conventional technology described above has a problem that defective items including an organic light-emitting element with a short brightness life cannot be discriminated, raising a possibility of shipping the defective items.

The present disclosure provides a display device manufacturing method that discriminates defective items with a short brightness life.

Solution to Problem

A display device manufacturing method disclosed herein includes: lighting up a display device for a predetermined period; measuring, as first brightness, brightness of the display device at a start of lighting; measuring, as second brightness, brightness of the display device when the predetermined period has elapsed; calculating a deterioration rate of the second brightness with respect to the first brightness; and discriminating the display device as a defective item when the deterioration rate is greater than a threshold value.

Advantageous Effects of Invention

The display device manufacturing method according to the present disclosure is capable of discriminating defective items with a short brightness life.

DESCRIPTION OF EMBODIMENT

The following is a detailed description of an embodiment, with reference to the accompanying drawings. It should be noted however that an overly detailed description may be omitted in some cases. For example, a detailed description of a well-known matter or a redundant description of substantially the same structural components will be sometimes omitted. This is to avoid unneeded redundancy in the following description and facilitate understanding of a person having an ordinary skill in the art.

It should be noted that the inventor of the present application provides the attached drawings and the following description in order for a person having an ordinary skill in the art to fully understand the present disclosure, and does not intend that these drawings and description will limit the subject matter recited in the claims.

Embodiment

Hereinafter, a display device manufacturing method in an embodiment will be described with reference to the accompanying drawings.

[1-1. Display Device Manufacturing Method]
[1-1-1. Overview of Manufacturing Method]

Figure 1:
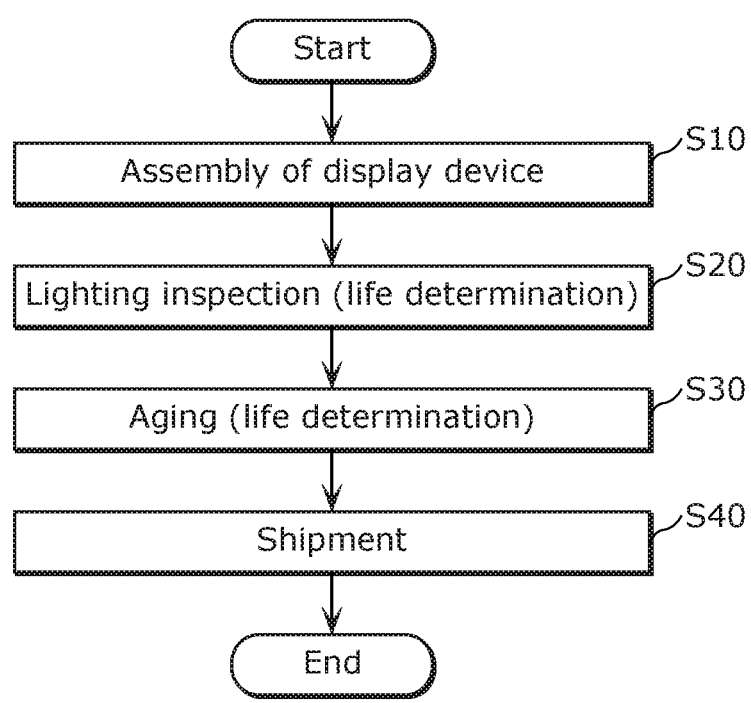
FIG. 1 is a flowchart illustrating a general example of a display device manufacturing method in an embodiment.

FIG. 1 is a flowchart illustrating a general example of a display device manufacturing method in an embodiment. The display device manufacturing method in this figure includes assembling a display device (S10), performing lighting inspection of the assembled display device (S20), aging the display device (S30), and then shipping the display device (S40). Furthermore, in either one of the lighting inspection in Step S20 and the aging in Step S30, a life inspection is performed for discriminating defective items with a short brightness life. In other words, since the display device is lit up in both of the lighting inspection and the aging, the life inspection is performed by making use of their lighting time. The life inspection may be performed in either of the lighting inspection in Step S20 and the aging in Step S30 as long as lighting time for at least a predetermined period necessary for the life inspection can be secured. If the lighting time in the lighting inspection and the aging is shorter than the predetermined period, it may also be possible to include an independent step of performing a life inspection before Step S40.

Typically, the display device is an organic electroluminescent (EL) display device. Furthermore, in the assembly of the display device in Step S10, it may be possible to assemble a finished product including an external housing, or a display panel that is in a displayable state if connected with a test apparatus although an external housing or a part of circuits such as a power supply circuit are not yet mounted. In the case where the display panel is assembled in the assembly of the display device in Step S10, a step of assembling a finished product may be performed before Step S40.

The lighting inspection in Step S20 examines whether or not at least a predetermined number of pixels among all pixels in the display device are lit up. The aging in Step S30 is so-called breaking-in, and a step performed for stabilizing an overall circuit operation for lighting up.

[1-1-2. Details of Life Inspection]

Now, an exemplary process of the life inspection performed in Step S20 or Step S30 in FIG. 1, or an independent step will be described in detail.

Figure 2:
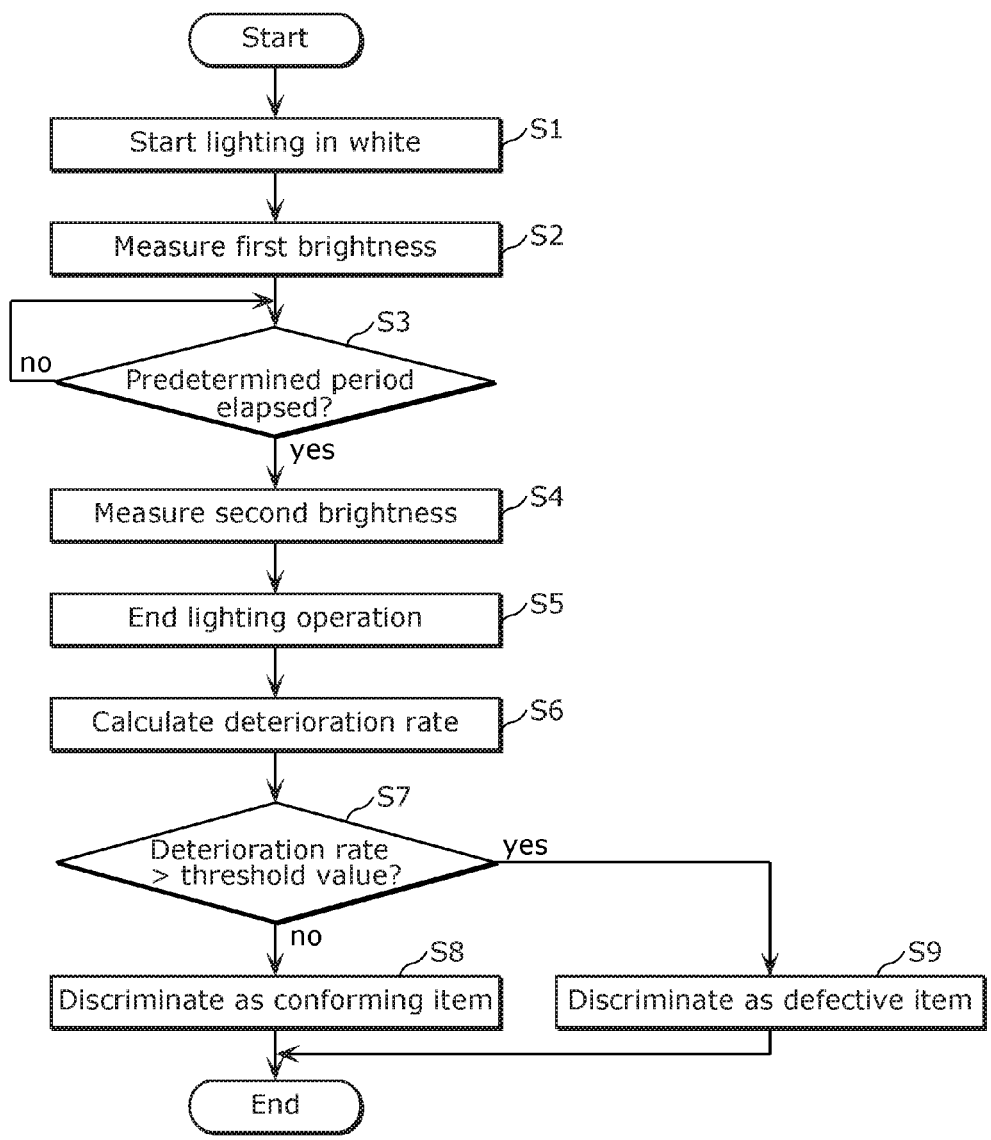
FIG. 2 is a flowchart illustrating an exemplary processing of life determination in which lighting for a predetermined period is performed in the embodiment.

FIG. 2 is a flowchart illustrating an exemplary processing method of life determination in which lighting for a predetermined period is performed in an embodiment.

First, the processing method of the life determination in this figure starts lighting up a whole screen in white (S1). In this case of lighting in white, all the pixels of red, green, and blue are lit up simultaneously. In order to measure a brightness deterioration degree, the brightness in the pixels of each color may be maximum brightness or close to the maximum brightness.

Next, the brightness of the display device at the start of lighting is measured as first brightness (S2). When a predetermined period has elapsed (yes in S3), the brightness of the display device is measured as second brightness (S4), and thereafter, the lighting is ended (S5). The measurements of the first brightness and the second brightness may be a measurement of the brightness of the entire screen or a measurement of the brightness at a sample position, which corresponds to a group of pixels in a part of all the pixels. Herein, the predetermined period is a period during which the brightness deterioration leading to a defective item occurs, and which is obtained experimentally. This predetermined period is, for example, one hour and may be any period ranging from 0.5 hour to 1.5 hour.

Subsequently, a deterioration rate of the second brightness with respect to the first brightness is calculated (S6). This deterioration rate is obtained by calculating, for example, (first brightness second brightness)/(first brightness)×100%.

Furthermore, it is determined whether or not the deterioration rate is greater than a threshold value (S7). If the deterioration rate is determined to be less than or equal to the threshold value (no in S7), the display device is discriminated as a conforming item (S8). If the deterioration rate is determined to be greater than the threshold value (yes in S7), the display device is discriminated as a defective item (S9).

[1-1-3. Example of Brightness Measurement]

Now, the following is a description of how to measure the first brightness and the second brightness.

Figure 3:
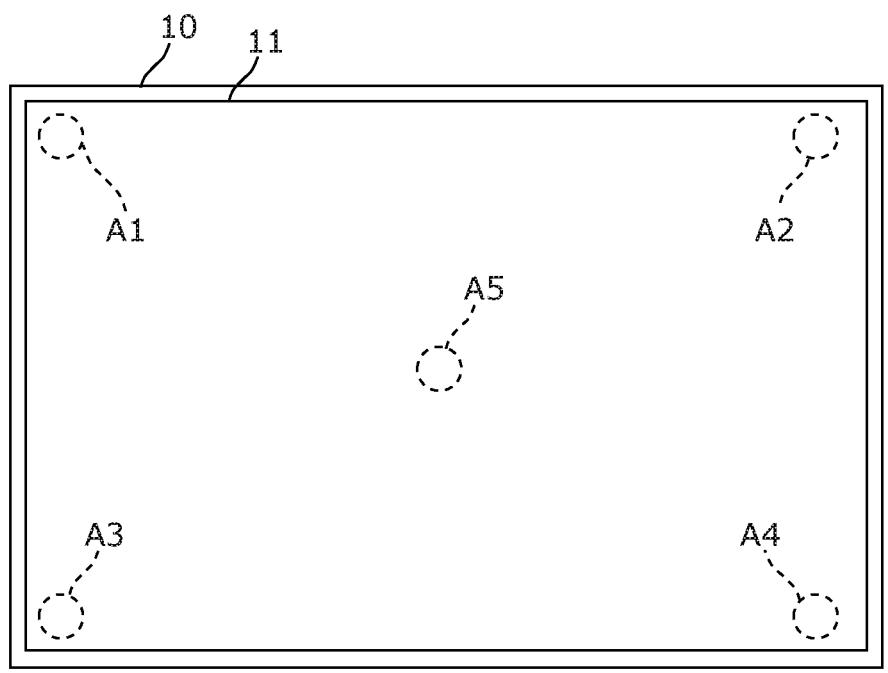
FIG. 3 illustrates sample positions for brightness measurement in the embodiment.

FIG. 3 illustrates sample positions for brightness measurement in the embodiment. In this figure, five sample regions A1 to A5 are illustrated as the sample positions for brightness measurement in a display screen 11 of a display device 10. The sample regions A1 and A4 are located near four corners of the display screen 11. The sample region A5 is located in the vicinity of the center of the display screen 11. All of these sample regions are positioned in a region where brightness deterioration tends to be noticeable.

Each of the sample regions A1 to A5 may have a diameter ranging from one centimeter to several centimeters and have an area equivalent to a light receiving area of a brightness measurement instrument. The brightness measurement instrument may be a photodiode, a phototransistor, a photosensor, an image sensor or the like and measure brightness while being pressed into direct contact with the surface of the sample region. Furthermore, the deterioration rate in Step S6 in FIG. 2 may be calculated for each of the sample regions or calculated as an average of the sample regions. In the case of calculating the deterioration rate for each of the sample regions, if the deterioration rate in any one of the sample regions is greater than the threshold value in Step S7 and Step 9, the display device may be discriminated as a defective item.

Although FIG. 3 has illustrated the five sample regions, the number of the sample regions may be any number greater than or equal to 1.

[1-2. Advantageous Effects, Etc.]

As described above, a display device manufacturing method disclosed herein includes: lighting up a display device for a predetermined period; measuring, as first brightness, brightness of the display device at a start of lighting; measuring, as second brightness, brightness of the display device when the predetermined period has elapsed; calculating a deterioration rate of the second brightness with respect to the first brightness; and discriminating the display device as a defective item when the deterioration rate is greater than a threshold value.

This makes it possible to discriminate defective items with a short brightness life.

Here, in the lighting-up of the display device for the predetermined period, the display device may be lit up at maximum brightness.

This makes it possible to shorten the time needed for discriminating a defective item with a short brightness life.

Here, the lighting-up of the display device for the predetermined period may be performed in one of a lighting inspection of a panel before shipment and aging before shipment.

This eliminates the need for providing a separate period for discriminating a defective item with a short brightness life. In other words, even if man-hours are needed for discriminating a defective item with a short brightness life, a period from assembly to shipment of the display device can be made equivalent to that in the case of not discriminating a defective item with a short brightness life.

Here, the display device may be an organic electroluminescent (EL) display device including red, green, and blue pixels that are disposed two-dimensionally, and in the lighting-up of the display device for the predetermined period, the display device may be lit up in white by lighting up the red, green, and blue pixels simultaneously over an entire screen.

In this way, since the display device is lit up in white, namely, all the pixels in three different colors are lit up simultaneously, it is possible to shorten the time needed for discriminating a defective item.

As described above, an embodiment has been described as an exemplary technique in the present disclosure. However, the technique in the present disclosure is not limited to the above but can be applied to an embodiment that is subjected to any modification, replacement, addition, omission and so on. Furthermore, individual structural components described in the above embodiment can be varied to provide another embodiment.

Now, the following is an illustrative description of variations of the embodiment.

(Variation 1)

In the embodiment described above, an example has been described in which, in the lighting-up (lighting-up in S1 to S5 in FIG. 2) of the display device for a predetermined period (a period from S2 to S4 in FIG. 2), the display device is lit up in white by lighting up the pixels of red, green, and blue simultaneously over the entire screen and at maximum brightness. In order to determine brightness deterioration, it is only necessary to calculate a deterioration degree after each of the pixels is lit up substantially for a predetermined period. Thus, the lighting-up of the display device for a predetermined period is not limited to lighting-up in white. Variation 1 will be directed to life determination in which, in the lighting-up of the display device for a predetermined period, the display device is lit up in each color while sequentially switching the red, green, and blue pixels in a whole screen.

Figure 4:
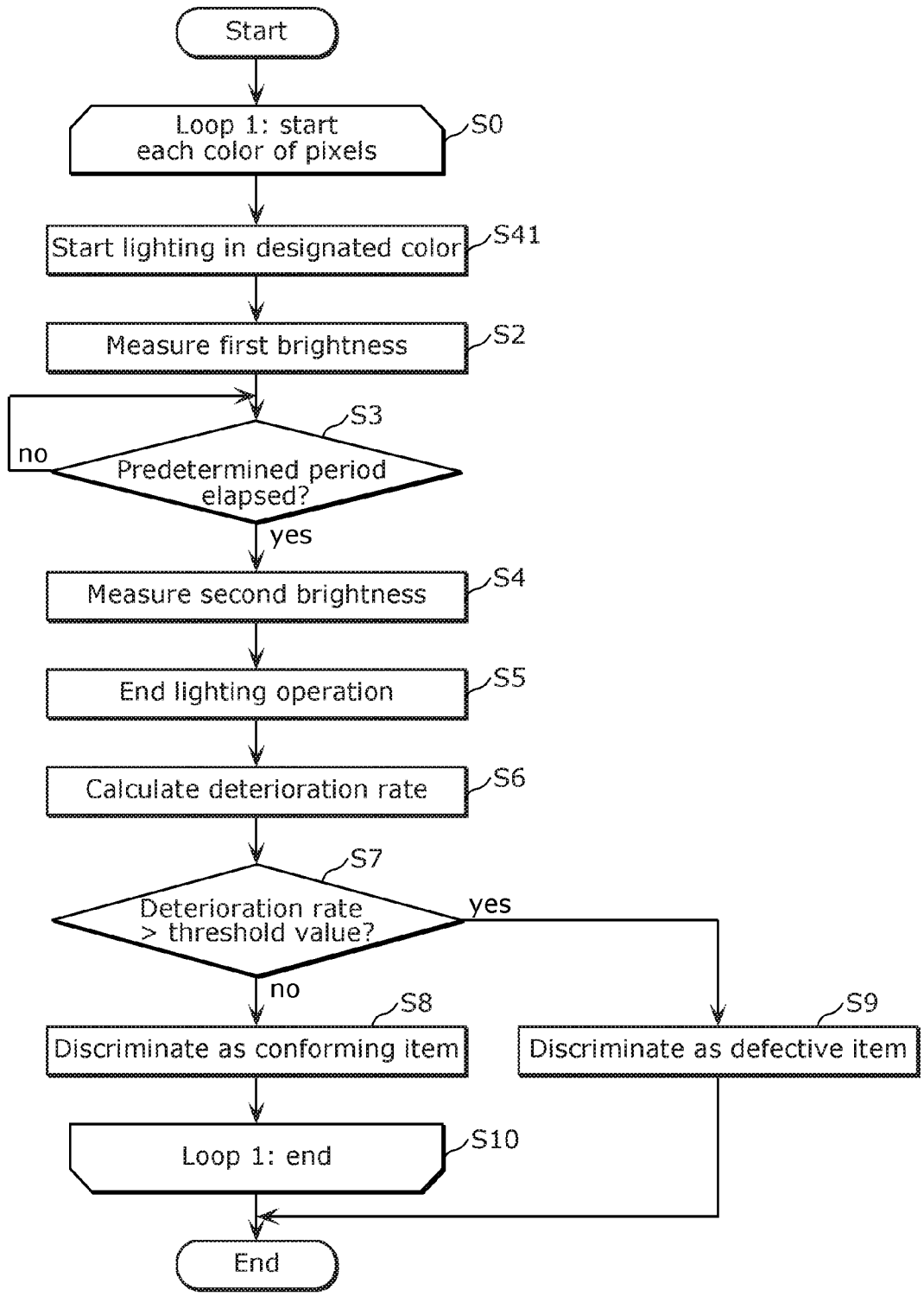
FIG. 4 is a flowchart illustrating an exemplary processing of life determination in which a whole screen is lit up in each color in Variation 1 of the embodiment.

FIG. 4 is a flowchart illustrating an exemplary processing of life determination in which a whole screen is lit up in each color in Variation 1. This figure is different from FIG. 2 in that a loop processing for each color of red, green, and blue (Step S0 and Step S10) is added and in that Step S1 is replaced by Step S41. The following description will be mainly directed to these differences.

In Steps S0 to S10, three times of loop processing that sequentially designate three colors of red, green, and blue are performed.

Step S41 lights up the pixels of the designated color in the whole screen.

As described above, in the exemplary processing in FIG. 4, the pixels of red, green, and blue in the whole screen are sequentially switched to be lit up each for a predetermined period. In this manner, in Steps S2 and S4, the first brightness and the second brightness are measured for each color. In Step S6, the deterioration rate is calculated for each color. In Step S7, the deterioration rate is determined for each color. In Step S9, if the pixels of any one of red, green, and blue are determined to be defective, the processing of life determination is ended. In other words, if the pixels of any one color are determined to be defective, the display device is discriminated as a defective item.

Consequently, the life determination in Variation 1 can achieve an enhanced determination accuracy compared with FIG. 2 because the determination is performed for each color.

(Variation 2)

Variation 2 will be directed to life determination in which, in the lighting-up of the display device for a predetermined period, a white band having a predetermined width is lit up and scrolled through a screen.

Figure 5:
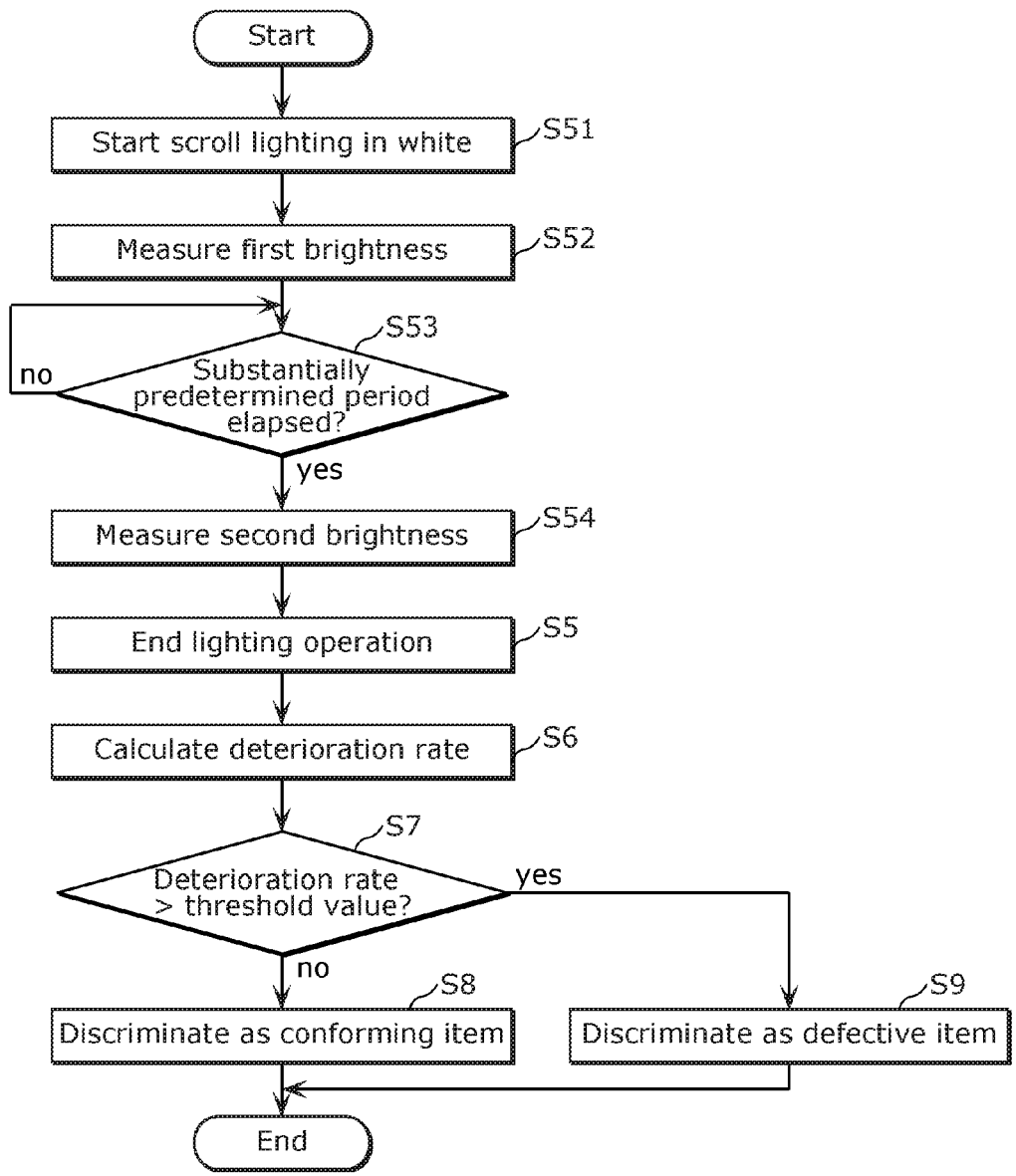
FIG. 5 is a flowchart illustrating an exemplary processing of life determination in which a white band is lit up and scrolled in Variation 2 of the embodiment.

FIG. 5 is a flowchart illustrating an exemplary processing of life determination in which a white band having a predetermined width is lit up and scrolled through a screen in Variation 2. This figure is different from FIG. 2 in that Steps S1 to S4 are replaced by Steps S51 to S54. The following description will be mainly directed to this difference.

First, the processing method of the life determination in FIG. 5 starts lighting up and scrolling a white band having a predetermined width (S51). In this white band having a predetermined width, all the pixels of red, green, and blue within a predetermined width are lit up simultaneously. In order to measure a brightness deterioration degree, the brightness in the pixels of each color may be maximum brightness or close to the maximum brightness.

Figure 6:
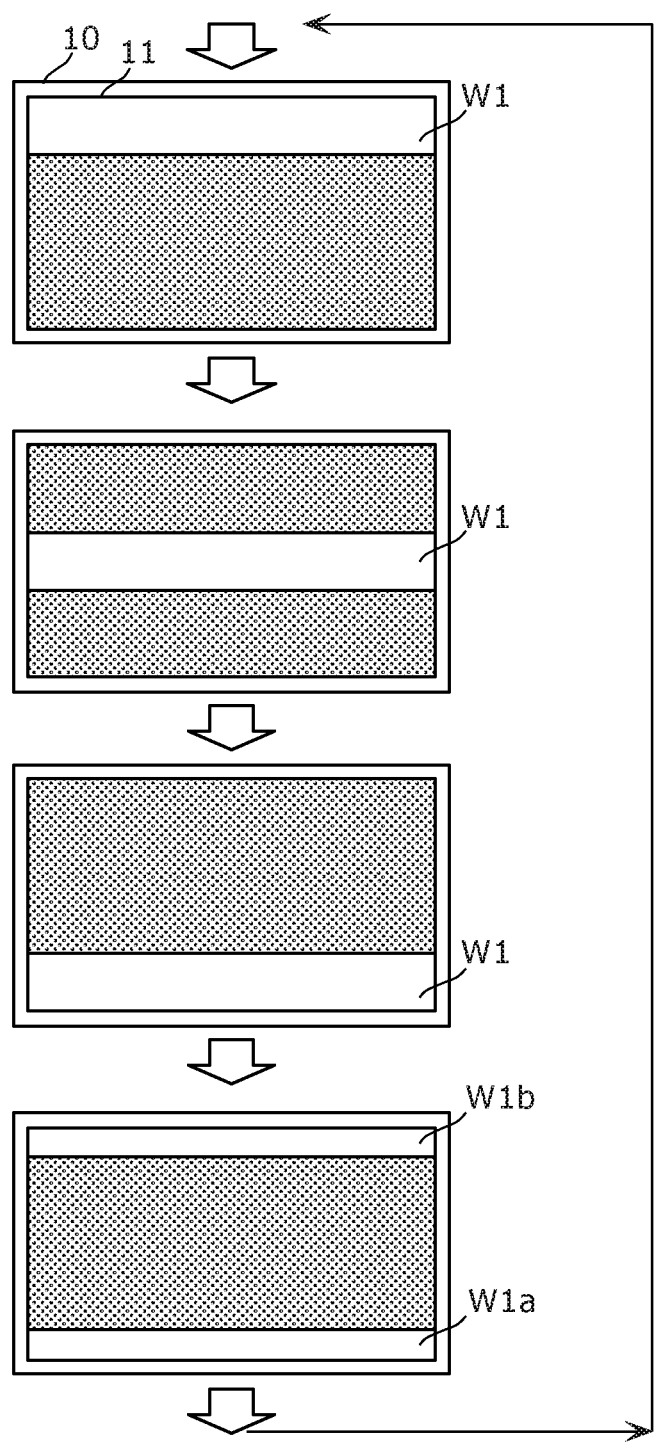
FIG. 6 is a drawing for describing how the white band is lit up and scrolled in the embodiment.

Herein, with reference to FIG. 6, scrolling of a white band will be described. FIG. 6 is a drawing for describing how the white band is lit up and scrolled. Four examples of the display screen 11 in FIG. 6 illustrate changes in the scrolling of the white band over time. In this figure, W1 indicates the white band having a predetermined width in a vertical direction. The predetermined width is, for example, a % (for example, 25%) of the total number of pixels in the vertical direction. In the third example of FIG. 6, the white band has reached the lowermost row. Thereafter, the white band is scrolled in such a manner as to be divided into two white bands W1a and W1b as illustrated in the fourth example of FIG. 6. The sum of the widths of the white bands W1a and W1b is equal to the width of the white band W1.

In Step S52 of FIG. 5, the brightness in a portion included in the white band is measured as the first brightness. Thus, the speed of scrolling may be a speed sufficiently allowing the brightness measurement. Furthermore, the scrolling may be temporarily stopped to measure the brightness.

In Step S53, whether or not all the pixels have emitted light for substantially a predetermined period is determined. In other words, when the width of the white band is a % of the total number of pixels in the vertical direction as mentioned above, it is determined whether or not a period of T0/a %×100 has elapsed with respect to a predetermined period T0 in the light emission in the whole screen in FIG. 2. For example, when the width of the white band is 25% and the predetermined period T0 in the light emission in the whole screen in FIG. 2 is one hour, the predetermined period in Step S53 is four hours. In this case, the substantial lighting period for each pixel is also one hour.

In Step S54, the brightness in a portion included in the white band is measured as the second brightness.

As described above, in the exemplary processing in FIG. 5, the white band is lit up and scrolled so that each pixel is lit up substantially for a predetermined period. In this manner, in the white scroll lighting of FIG. 5, each pixel is turned on and off repeatedly so as to be lit up more dynamically than FIG. 2. Thus, the scroll lighting is an operation closer to art actual image display.

Consequently, the life determination in Variation 2 can achieve an enhanced determination accuracy compared with FIG. 2.

(Variation 3)

Variation 3 will be directed to life determination in which, in the lighting-up of the display device for a predetermined period, a single-color band having a predetermined width is lit up in each color and scrolled through a screen.

Figure 7:
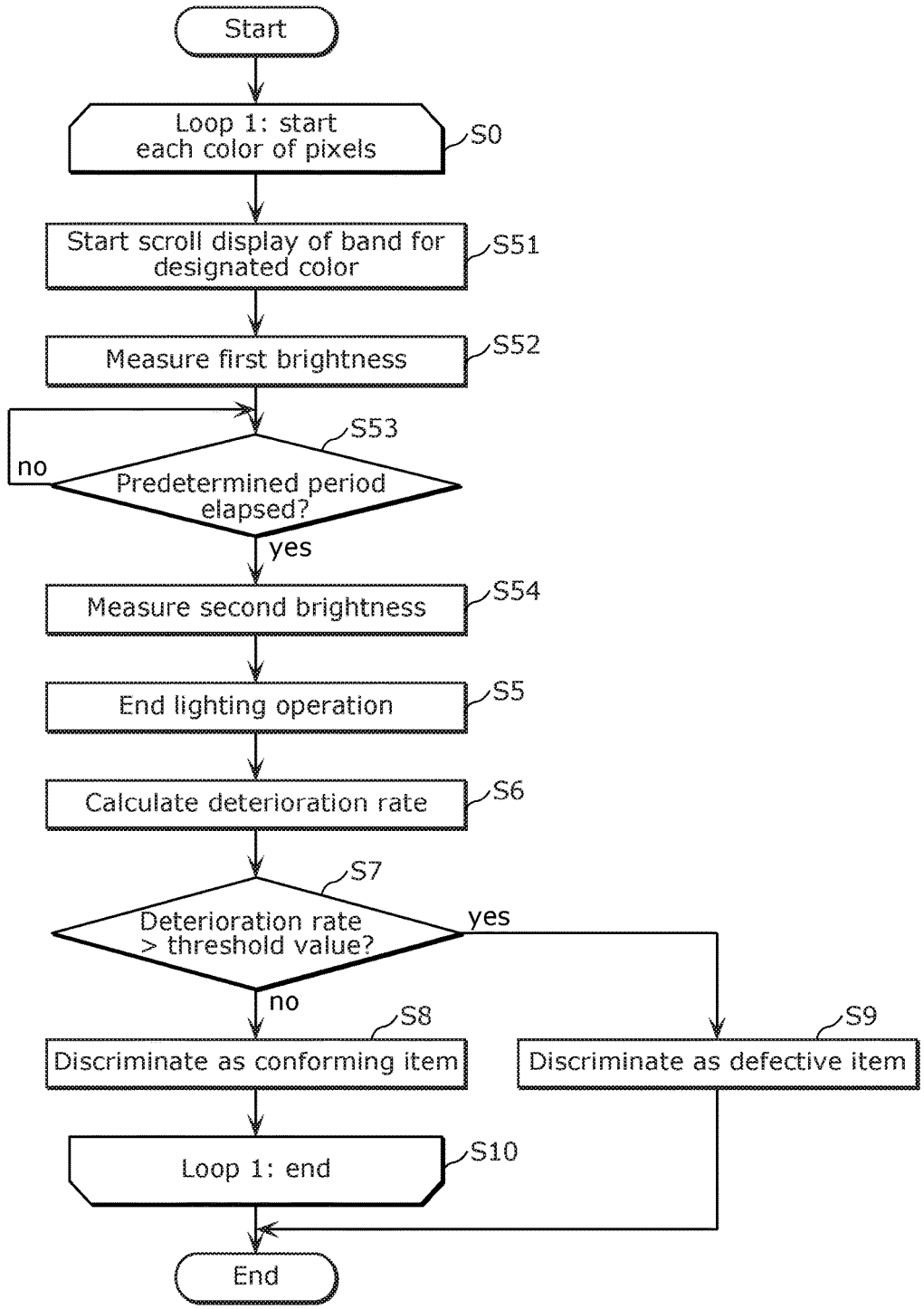
FIG. 7 is a flowchart illustrating an exemplary processing of life determination in which a color band is lit up in each color and scrolled in Variation 3 of the embodiment.

FIG. 7 is a flowchart illustrating an exemplary processing of life determination in which a band is lit up in each color and scrolled in Variation 3. This figure is different from FIG. 5 in that a loop processing for each color of red, green, and blue (Step S0 and Step S10) is added. The following description will be mainly directed to this difference.

In Steps S0 to S10, three times of loop processing that sequentially designate three colors of red, green, and blue are performed.

First, the processing method of the life determination in FIG. 7 starts lighting up and scrolling a color band having a predetermined width for the color designated in Step S0 (S51). In this color band having a predetermined width, pixels of the designated color within a predetermined width are lit up simultaneously. In order to measure a brightness deterioration degree, the brightness in the pixels may be maximum brightness or close to the maximum brightness. The scroll lighting of the color band is similar to FIG. 6 except that the band has any one of the colors other than white.

In this manner, in the exemplary processing of FIG. 7, if the pixels of any one color are determined to be defective, the display device is discriminated as a defective item, and the scroll lighting is an operation closer to an actual image display.

Consequently, the life determination in Variation 3 can achieve an enhanced determination accuracy compared with FIG. 5.

(Variation 4)

Although the bands for individual colors having a predetermined width each have been lit up and scrolled by the three times of loop processing in Variation 3, Variation 4 will be directed to life determination in which bands for the individual colors having a predetermined width are lit up and scrolled simultaneously.

Figure 8:
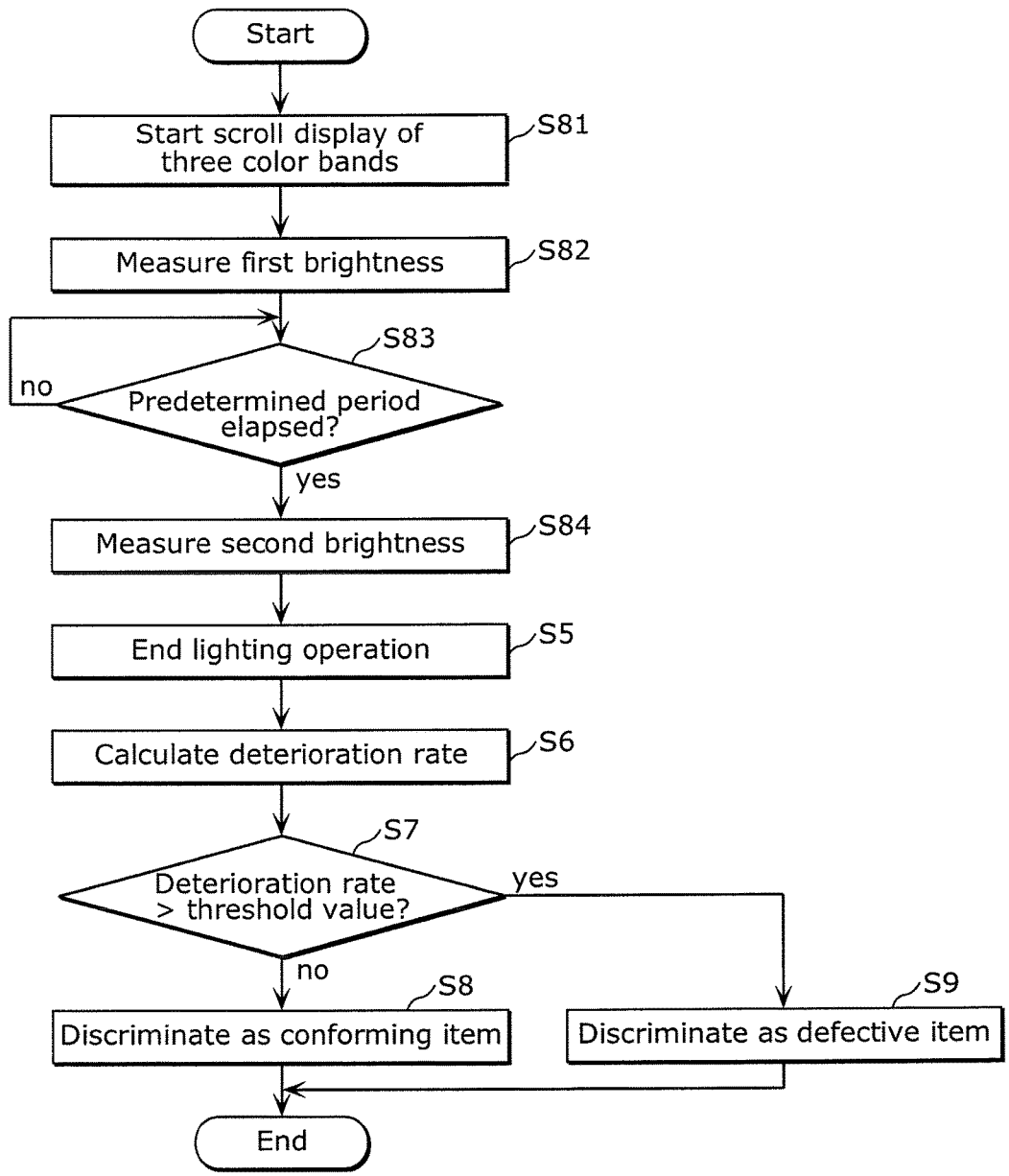
FIG. 8 is a flowchart illustrating an exemplary processing of life determination in which color bands are lit up and scrolled in Variation 4 of the embodiment.

FIG. 8 is a flowchart illustrating an exemplary processing of life determination in which the color bands are lit up and scrolled in Variation 4. FIG. 8 is different from FIG. 7 in that the loop processing (Steps S0 and S10) is omitted and in that Steps S51 to S54 are replaced by Steps S81 to S84. The following description will be mainly directed to these differences.

Figure 9:
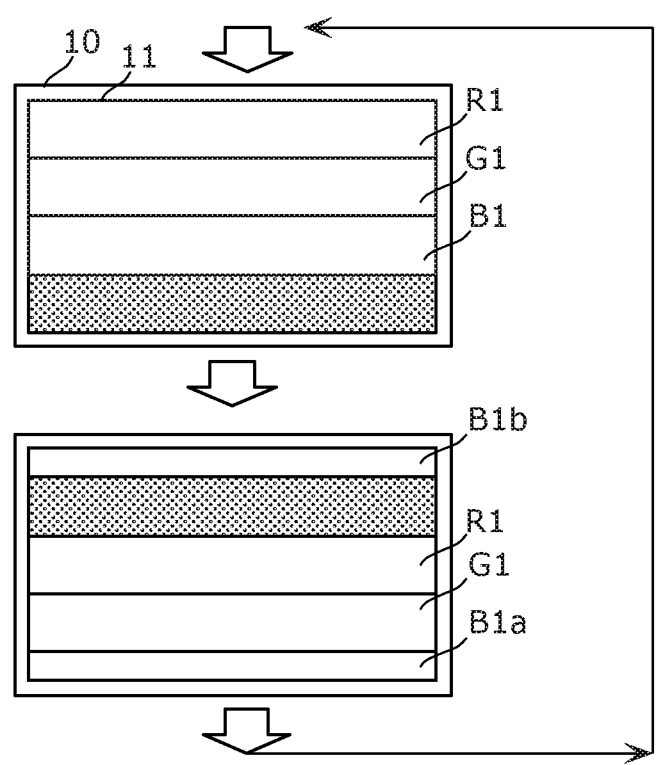
FIG. 9 is a drawing for describing how the color bands are lit up and scrolled in Variation 4 of the embodiment.

First, the processing method of the life determination in FIG. 8 starts scrolling three color bands (S81). FIG. 9 is a drawing for describing how the three color bands are lit up and scrolled. As illustrated in the upper portion of FIG. 9, the three color bands, which are a red color band R1, a green color band G1, and a blue color band B1, are displayed on the display screen 11. The three color bands are scrolled downward from the upper end of the display screen 11 while maintaining a predetermined width.

In Step S82 of FIG. 8, the brightness in a portion included in each of the color bands is measured for each color as the first brightness. Thus, the speed of scrolling may be a speed sufficiently allowing the brightness measurement. Furthermore, the scrolling may be temporarily stopped to measure the brightness.

In Step S83, whether or not all the pixels have emitted light for substantially a predetermined period is determined. In other words, when the width of each of the color bands is a % of the total number of pixels in the vertical direction, it is determined whether or not a period of T0/a %×100 has elapsed with respect to a predetermined period T0 in the light emission in the whole screen in FIG. 2. For example, when the width of each of the color bands is 25% and the predetermined period T0 in the light emission in the whole screen in FIG. 2 is one hour, the predetermined period in Step S83 is four hours. In this case, the substantial lighting period for each pixel is also one hour.

In Step S84, the brightness in a portion included in each of the color bands is measured for each color as the second brightness.

As described above, in the exemplary processing in FIG. 8, the three color bands are lit up and scrolled so that each pixel is lit up substantially for a predetermined period. In this manner, in the scroll lighting of the three color bands in FIG. 8, each pixel is turned on and off repeatedly so as to be lit up more dynamically than FIG. 2. Thus, the scroll lighting is an operation closer to an actual image display. Moreover, the period needed for life determination can be reduced to one third of that in FIG. 7.

Consequently, the life determination in Variation 4 can achieve an enhanced determination accuracy and a shorter determination period compared with FIG. 7.

It should be noted that the widths of the individual color bands in Variations 3 and 4 may be different or the same among colors.

Incidentally, although the exemplary processing in Steps S2 and S4 of FIG. 2 in the embodiment (in which the whole screen is lit up in white) has been directed to a case of measuring the brightness of white as the first brightness and the second brightness, not only the brightness of white but also the individual brightness of red, green, and blue may be measured. In other words, four kinds of brightness of white, red, green, and blue may be measured individually as the first brightness and the second brightness. In this case, the deterioration rate may be determined for each of the four kinds of brightness in Step S7, and if the deterioration rate of at least one of the four kinds of brightness is greater than the threshold value in Step S9, the display device may be discriminated as a defective item.

Incidentally, although the exemplary processing in Steps S52 and S54 of FIG. 5 in Variation 2 (in which the white band is lit up and scrolled) has been directed to a case of measuring the brightness of white as the first brightness and the second brightness, not only the brightness of white but also the individual brightness of red, green, and blue may be measured. In other words, four kinds of brightness of white, red, green, and blue may be measured individually as the first brightness and the second brightness. In this case, the deterioration rate may be determined for each of the four kinds of brightness in Step S7, and if the deterioration rate of at least one of the four kinds of brightness is greater than the threshold value in Step S9, the display device may be discriminated as a defective item.

As described above in several Variations, according to a display device manufacturing method disclosed herein, in the lighting-up of the display device for the predetermined period, the display device may be lit up by sequentially switching among the red, green, and blue pixels over an entire screen so that a lighting period for each color is the predetermined period.

This makes it possible to determine the deterioration rate for each color, thereby achieving an enhanced discrimination accuracy of a defective item with a short brightness life.

Here, in the lighting-up of the display device for the predetermined period, a white band image having a predetermined width may be displayed and scrolled through a screen.

In this way, the scroll display is closer to an actual image display, thereby achieving an enhanced discrimination accuracy of a defective item with a short brightness life.

Here, in the lighting-up of the display device for the predetermined period, color band images in individual colors of the red, green, and blue pixels each having a predetermined width may be displayed and scrolled through a screen, and a sum of lighting periods for each of the red, green, and blue pixels may be the predetermined period This makes it possible to determine the deterioration rate for each color so as to perform the scroll display closer to an actual image display, thereby achieving an enhanced determination accuracy of a defective item with a short brightness life.

In the lighting-up of the display device for a predetermined period in the embodiment described above, in the case of lighting up the whole screen in each color or lighting up and scrolling a color band in each color, the pixels may be lit up or the deterioration rate may be determined in descending order of light energy, namely, the order of blue, green, and red.

Furthermore, the above description has been directed to an example in which the display device is an organic EL display device. However, the display device may also be a plasma display panel (PDP) display device or an inorganic EL display device. Although the above description has been directed to an example in which the display device includes red, green, and blue pixels that are disposed two-dimensionally, the display device may also be an illumination apparatus including, for example, an organic EL light-emitting element as a light source.

As described above, an embodiment has been described as an exemplary technique in the present disclosure. For that purpose, the attached drawings and the detailed description have been presented.

Thus, the structural components illustrated in the attached drawings and the detailed description could include not only structural components necessary for solving the problem but also structural components that are only necessary for illustrating the above-noted technique and unnecessary for solving the problem. Accordingly, these unnecessary structural components should not be considered necessary immediately because these unnecessary structural components are illustrated in the attached drawings and the detailed description.

Moreover, since the embodiment described above is intended for illustrating the technique in the present disclosure, such an embodiment can be subjected to various modifications, replacement, addition, omission and so on within the scope of the claims or the scope equivalent thereto.

INDUSTRIAL APPLICABILITY

The present disclosure is applicable to a display device.
The invention claimed is:
1. A display device manufacturing method comprising:
lighting-up a target display device, at a first time point;
measuring, as first brightness, brightness of the target display device at a second time point after the lighting-up of the target display device at the first time point;
measuring, as second brightness, brightness of the target display device at a third time point when a predetermined period has elapsed from the second time point;
terminating, after measuring the second brightness, lighting of the target display device;
after terminating the lighting of the target display device, calculating, using the first brightness measured at the second time point and the second brightness measured at the third time point, a deterioration rate of the second brightness with respect to the first brightness;
determining that the target display device is defective when the deterioration rate is greater than a threshold value; and
determining that the target display device is conforming when the deterioration rate is less than or equal to the threshold value.

2. The display device manufacturing method according to claim 1,
wherein in the lighting-up of the target display device during the predetermined period, the target display device is lit up at maximum brightness.

3. The display device manufacturing method according to claim 1,
wherein the lighting-up of the target display device during the predetermined period is performed in one of a lighting inspection of a panel before shipment and aging before shipment.

4. The display device manufacturing method according to claim 1,
wherein the target display device is an organic electroluminescent (EL) display device including red, green, and blue pixels that are disposed two-dimensionally, and
in the lighting-up of the target display device during the predetermined period, the target display device is lit up in white by lighting-up the red, green, and blue pixels simultaneously over an entire screen.

5. The display device manufacturing method according to claim 1,
wherein the target display device includes red, green, and blue pixels that are disposed two-dimensionally, and
in the lighting-up of the target display device during the predetermined period, the target display device is lit up by sequentially switching among the red, green, and blue pixels over an entire screen so that a lighting period for each color is the predetermined period.

6. The display device manufacturing method according to claim 1,
wherein the target display device includes red, green, and blue pixels that are disposed two-dimensionally,
in the lighting-up of the target display device during the predetermined period, a white band image having a predetermined width is displayed and scrolled through a screen, and
a sum of lighting periods for each of the red, green, and blue pixels is the predetermined period.

7. The display device manufacturing method according to claim 1,
wherein the target display device includes red, green, and blue pixels that are disposed two-dimensionally,
in the lighting-up of the target display device during the predetermined period, color band images in individual colors of the red, green, and blue pixels each having a predetermined width are displayed and scrolled through a screen, and
a sum of lighting periods for each of the red, green, and blue pixels is the predetermined period.

8. The display device manufacturing method according to claim 1,
wherein the first brightness is an average of brightness values at two or more areas of the target display device at the second time point, and
wherein the second brightness is an average of brightness values at the two or more areas of the target display device at the third time point.

9. The display device manufacturing method according to claim 8,
wherein a size of the two or more areas of the target display device is at least 1 centimeter (cm) in diameter.

10. The display device manufacturing method according to claim 8,
   wherein one area of the two or more areas of the target display device is located at a central region of the target display device.

11. The display device manufacturing method according to claim 1,
   wherein the deterioration rate is calculated by dividing a sum of the first brightness and the second brightness, by the first brightness.

12. The display device manufacturing method according to claim 1,
   wherein the lighting-up includes lighting-up a whole screen of the target display device.

13. The display device manufacturing method according to claim 1,
   wherein the predetermined period is a period of time ranging between 0.5 hour to 1.5 hour.

14. The display device manufacturing method according to claim 8,
   wherein one area of the two or more areas of the target display device is located at a corner region of the target display device.

15. The display device manufacturing method according to claim 1, further comprising:
   determining whether or not all of the pixels emitted light during the predetermined period.

16. The display device manufacturing method according to claim 8,
   wherein one area of the two or more areas of the target display device includes five separate regions of the display device.

\* \* \* \* \*